United States Patent
Kimura et al.

(10) Patent No.: US 8,415,797 B2
(45) Date of Patent: Apr. 9, 2013

(54) GOLD WIRE FOR SEMICONDUCTOR ELEMENT CONNECTION

(75) Inventors: Keiichi Kimura, Futtsu (JP); Tomohiro Uno, Futtsu (JP); Takashi Yamada, Iruma (JP); Kagehito Nishibayashi, Iruma (JP)

(73) Assignees: Nippon Steel & Sumikin Materials Co., Ltd., Tokyo (JP); Nippon Micrometal Corporation, Saitama (JP)

( * ) Notice: Subject to any disclaimer, the term of this patent is extended or adjusted under 35 U.S.C. 154(b) by 0 days.

(21) Appl. No.: 12/294,416

(22) PCT Filed: Mar. 23, 2007

(86) PCT No.: PCT/JP2007/056011
§ 371 (c)(1),
(2), (4) Date: Sep. 24, 2008

(87) PCT Pub. No.: WO2007/111248
PCT Pub. Date: Oct. 4, 2007

(65) Prior Publication Data
US 2009/0115059 A1 May 7, 2009

(30) Foreign Application Priority Data
Mar. 24, 2006 (JP) ................. 2006-082565
Jan. 25, 2007 (JP) ................. 2007-015430

(51) Int. Cl.
H01L 23/49 (2006.01)
(52) U.S. Cl. .. 257/741; 257/762; 257/784; 257/E23.025
(58) Field of Classification Search .................. 257/741, 257/E23.025
See application file for complete search history.

(56) References Cited

U.S. PATENT DOCUMENTS

| 5,702,814 A * | 12/1997 | Hanada et al. ................ 428/364 |
| 6,103,025 A * | 8/2000 | Herklotz et al. ............. 148/430 |
| 2005/0079347 A1 * | 4/2005 | Uno et al. ..................... 428/364 |
| 2008/0105975 A1 * | 5/2008 | Kimura et al. ................ 257/741 |

FOREIGN PATENT DOCUMENTS

| JP | 61-084346 A | 4/1986 |
| JP | 03257129 | 11/1991 |
| JP | 07335685 | 12/1995 |
| JP | 09316567 | 12/1997 |
| JP | 2000040710 | 2/2000 |
| JP | 2000144282 | 5/2000 |
| JP | 2001345342 | 12/2001 |
| JP | 2005294681 | 10/2005 |
| JP | 2007019349 | 1/2007 |

* cited by examiner

OTHER PUBLICATIONS

Japanese Office Action issued in Japanese Patent Application No. 2007-015430 dated Jul. 10, 2012.

Primary Examiner — Lynne Gurley
Assistant Examiner — Vernon P Webb
(74) Attorney, Agent, or Firm — McDermott Will & Emery LLP

(57) ABSTRACT

A gold wire for semiconductor element connection having high strength and bondability. The connection has a limited amount of at least one element selected from calcium and rare earth elements, and a limited amount of at least one element selected from a group consisting of titanium, vanadium, chromium, hafnium, niobium, tungsten, and zirconium. The incorporation of a suitable amount of palladium or beryllium is preferred. The incorporation of calcium and rare earth element can improve the strength and young's modulus of a gold wire, and the incorporation of titanium and the like can reduce a deterioration in the roundness of press-bonded shape of press-bonded balls in the first bonding caused by the incorporation of calcium and rare earth elements. The bonding wire can simultaneously realize mechanical properties and bondability capable of meeting a demand for a size reduction in semiconductor and a reduction in electrode pad pitch.

20 Claims, 1 Drawing Sheet

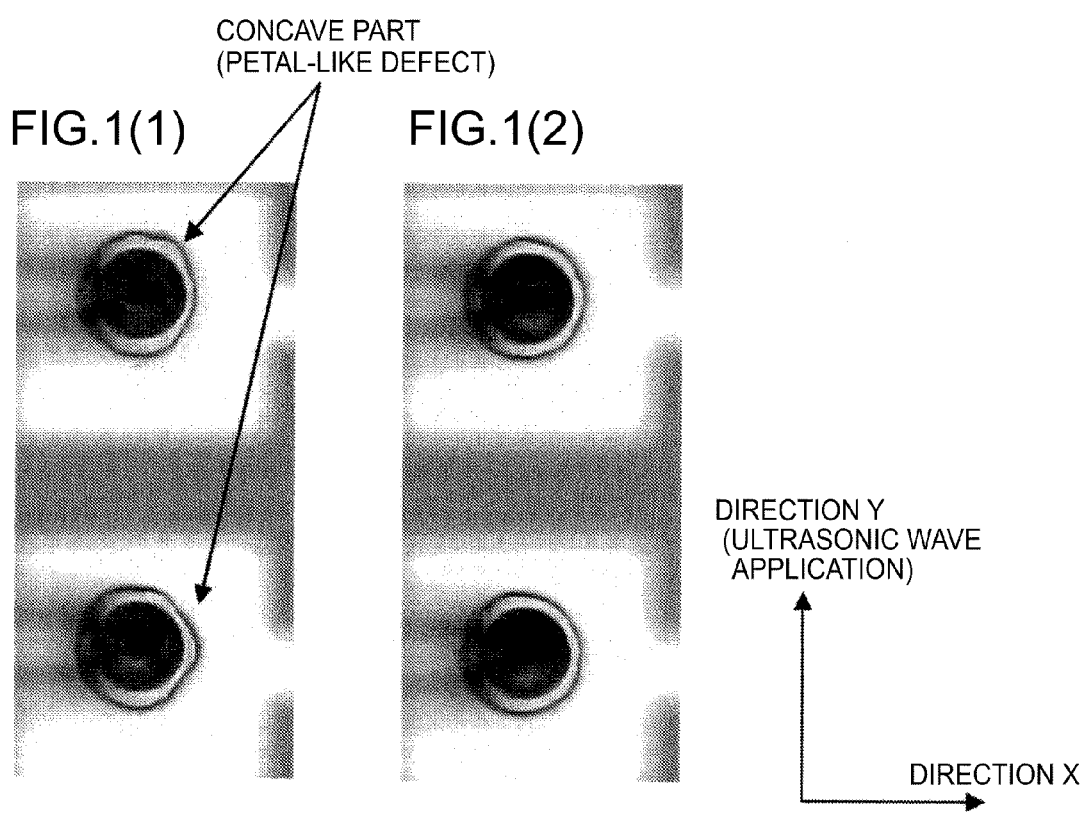

US 8,415,797 B2

GOLD WIRE FOR SEMICONDUCTOR ELEMENT CONNECTION

CROSS-REFERENCE TO RELATED APPLICATIONS

This is the U.S. national phase application under 35 U.S.C. §371 of International Patent Application No. PCT/JP2007/056011, filed Mar. 23, 2007, and claims the benefit of Japanese Application Nos. 2006-082565, filed Mar. 24, 2006 and 2007-015430 filed Jan. 25, 2007, all of which are incorporated by reference herein. The International Application was published in Japanese on Apr. 10, 2007 as International Publication No. WO 2007/111248 A1 under PCT Article 21(2).

TECHNICAL FIELD

The present invention relates to a gold wire for semiconductor element connection.

BACKGROUND OF THE INVENTION

Bonding wires used as materials for mounting semiconductors, including a gold wire for semiconductor element connection, are materials for connecting a semiconductor chip with external metal terminals. At present, most of such bonding wires are made using a material mainly comprised of gold. The main reason for this is that a so-called "ball bonding" technique of high throughput and high productivity is used for connecting semiconductor devices with external terminals. "Ball bonding" is a method comprising melting one end of a bonding wire to form a free air ball (FAB), pressing the FAB against one electrode to bond with it, and press-bonding the side surface of the bonding wire to another electrode as it is. Hereinafter, the ball bonding will be referred to as "first bonding", and the bonding for press-bonding the side of the wire to an electrode is referred to as "second bonding" The reason why gold is used so much is that surface oxidation of free air balls or bonding wires is less likely to cause deterioration in bondability of the first and second bondings, and thus the wire bonding in the atmosphere is easy to carry out.

Although strength of bonding wires is increased by work hardening at the time of drawing process, sufficient mechanical strength is not obtained with pure gold, and thus trace amounts of different elements are added thereto.

With recent progress in the downsizing of semiconductor mounting sizes, the sizes of electrode pads have become smaller, and the pitches thereof also have become narrower. As a result, the diameter of the bonding wire also needs to be small, so that a bonding wire of a 15 μm diameter has come into use. The downsizing of the wire diameter will cause the bonding wire to be broken during the manufacture thereof due to the strength thereof being insufficient at the time of drawing, or will make maintenance of a loop thereof difficult at the time of mounting process, such as wire bonding, resin encapsulation, etc. Accordingly, the strength of the bonding wire needs to be improved.

It is important to improve not only the strength of the bonding wire but also the elastic modulus thereof in order to maintain the loop at the time of the mounting process, such as wire bonding, resin encapsulation, etc. Specifically, the elastic modulus of the bonding wire in a longitudinal direction (hereafter Young's modulus) needs to be improved to prevent the occurrence of wire sweep at the time of resin encapsulation.

With the downsizing of semiconductor mounting sizes, the bonding wire is required to have improved bondability as a characteristic thereof. Additive elements generally used for the bonding wire, however, are easily oxidized at the time of formation of FABs. Thus, adding large amounts of the additive elements to the bonding wire will deteriorate the bondability of the first bonding. Moreover, the second bonding is also affected by the additive elements. In general, a better bondability can be achieved in the second bonding by adding smaller amounts of the additive elements as the less surface oxidization of the bonding wire is resulted in that case.

Recently, roundness of a press-bonded ball formed by press-bonding a FAB onto a pad has become an issue in connection with the first bonding. If pad pitches of electrodes on semiconductor chips become narrow with the downsizing of semiconductor chips, then the risk of occurrence of short-circuit caused by the press-bonded balls running over the adjacent edges of pads is increased in the event that shapes of the press-bonded balls in the first bonding get out of round. What is meant by the wording "out of round" herein is certain shapes of a press-bonded ball, which, for example, appear irregular like petals as illustrated in (1) of FIG. 1, or appear ellipse due to anisotropic deformation of the press-bonded ball between the direction of ultrasonic waves and the direction perpendicular thereto under the influence of the ultrasonic waves to assist in bonding at the time of wire bonding.

Additive elements for improving the roundness of press-bonded balls are disclosed in a number of patent publications. For example, 0.05-1% by mass of Cu, Pb, Li, and Ti in Patent Document 1; 0.00001-0.0002% by mass of Ti in Patent Document 2; 0.1-0.8% by mass of Pt in Patent Document 3; and 0.0001-0.01% by mass of Y in Patent Document 4 are disclosed as the additive elements effective for improving the roundness of press-bonded balls.

As for the additive elements effective for improving the roundness of press-bonded balls, neither any quantity thereof nor any particular element is to be specified, and thus, it is considered that they vary depending on how they are combined with other elements.

Bonding wires containing a high content of Ca or rare earth elements used for those of high strength and high-Young's modulus to meet the downsizing of semiconductor chips have a tendency for the roundness of the resultant press-bonded balls to deteriorate. Thus, additive elements which may coexist with Ca or rare earth elements and improve the bondability of FABs while maintaining mechanical characteristic are required.

Patent Document 1: Japanese Un-Examined Patent Application Publication No. H-9-316567
Patent Document 2: Japanese Un-Examined Patent Application Publication No. 2000-144282
Patent Document 3: Japanese Un-Examined Patent Application Publication No. H7-335685
Patent Document 4 Japanese Un-Examined Patent Application Publication No. 2001-345342

SUMMARY OF THE INVENTION

The present invention provides a gold wire for semiconductor element connection, which can solve the above-mentioned problems, realizing a good bondability and mechanical characteristic at the same time.

After the extensive studies of solutions to the foregoing problems, the present invention has been made as summarized below:

A gold wire for semiconductor element connection according to a first aspect of the present invention is characterized in comprising:

one ore more elements selected from Ca and rare earth elements in total amounts of at least 0.001% by mass but not more than 0.02% by mass;

one ore more elements selected from a group consisting of Ti, V, Cr, Hf, Nb, W and Zr in total amounts of at least 0.0005% by mass but not more than 0.01% by mass; and a balance of gold and unavoidable impurities.

The gold wire for semiconductor element connection according to a second aspect of the present invention is the one set forth in the first aspect characterized in comprising Pr having a content of 0.0016% or more by mass but not more than 0.0079% by mass.

The gold wire for semiconductor element connection according to a third aspect is the one set forth in the first or second aspect characterized in comprising at least one element selected from a group consisting of Ca, La, Ce, Pr, Nd and Sm in total amounts of more than 0.005% by mass but not more than 0.02% by mass, wherein a content of Ca is 0.0025% or less by mass.

The gold wire for semiconductor element connection according to a fourth aspect is the one set forth in any one of the first to third aspects characterized in further comprising Pd of 0.001% or more by mass but not more than 2% by mass.

The gold wire for semiconductor element connection according to a fifth aspect is the one set forth in any one of the first to fourth aspects characterized in further comprising Be of 0.0002% or more by mass but not more than 0.0011% by mass.

The gold wire for semiconductor element connection according to a sixth aspect is the one set forth in any one of the first to fifth aspects characterized in that crystal grains are <111>-oriented along a longitudinal direction of the wire, having an elastic modulus of 85 GPa or more in the longitudinal direction thereof.

The gold wire for semiconductor element connection according to a seventh aspect is the one set forth in any one of the first to sixth aspects characterized in that the wire is formed to a reduction in area of 99.8% or more as compared to an ingot thereof.

A gold wire for semiconductor element connection according to the present invention allows strength and Young's modulus thereof to be increased by containing specific amounts of Ca and rare earth elements, while allowing deteriorated roundness of a press-bonded ball shape caused by Ca and rare earth elements at the time of the first bonding to be improved by containing specific amounts of Ti, V, Cr, Hf, Nb, W and Zr. As a result, there can be provided a bonding wire having both mechanical characteristics and bondability that meet demands for the downsizing of semiconductor devices and the narrowing of pitches of pad electrodes, so that the bonding wire thus obtained can contribute to improvement in workability of the manufacture of semiconductor devices and product yield.

BRIEF DESCRIPTION OF THE DRAWING

FIG. 1 shows optical microscope images of typical press-bonded balls of sample 48(1) and sample 51(2), observed from above.

DETAILED DESCRIPTION OF THE INVENTION

Ca and rare earth elements improve strength and Young's modulus of bonding wires. On the other hand, the roundness of press-bonded balls deteriorate if the additive amount of Ca and rare earth elements increases. If a preset strength of a bonding wire for a gold wire for semiconductor element connection is low and the additive amount of Ca and rare earth elements is less than 0.001% by mass, then the problem on the roundness does not occur. If the additive amount of Ca and rare earth elements is increased up to 0.001% or more by mass to improve the strength and the Young's modulus, then the roundness of the press-bonded ball deteriorates. Moreover, if the additive amount of Ca and rare earth elements is increased to exceed 0.02% by mass, then the bondability noticeably deteriorates due to the oxidation of a FAB at the time of the wire bonding performed in the atmosphere, and thus it is no longer suitable for practical use.

Because Ti, V, Cr, Hf, Nb, W, and Zr are refractory metals, they are the elements to raise the solidus line of gold when added to gold. Ca and rare earth elements, however, work reversely. For a bonding wire with Ca or rare earth elements added, when a distal end of the bonding wire is melted at the time of formation of a FAB, the surface concentration of Ca or rare earth elements decreases due to oxidization occurring in the vicinity of the surface of the FAB, which, along with the heat extraction from the surface of the FAB, causes a faster solidification on the surface of the FAB than in the inside thereof. As a result, a shrinkage cavity occurs on the edge of the FAB, so that the shrinkage cavity and the surface itself interfere with isotropic change in shape of the press-bonded ball at the time of press-bonding the FAB, and thus the roundness of the press-bonded ball deteriorates. Ti, V, Cr, Hf, Nb, W and Zr have a role to compensate the rise of the solidus line on the surface of FAB. With Ca and rare earth elements being in the above-mentioned range of concentration, the concentration to obtain the beneficial compensation effect is at least 0.0005% by mass but not more than 0.01% by mass in the total amount of Ti, V, Cr, Hf, Nb, W, and Zr. As a rough measure of an amount to be added, they may desirably be added in the total concentration that is either half as much as that of Ca and rare earth elements or in a range of from quarter to one depending on the amount of Ca and rare earth elements to be added. The total amount of Ti, V, Cr, Hf, Nb, W, and Zr should be 0.01% or less by mass at maximum to avoid the deterioration of wire bondability due to oxidization. These elements may be added alone or in combination of one or more other elements.

Among the above elements, Ti and V are the ones advantageous to improving the roundness of the press-bonded ball. In addition to the above effect, Ti and V help miniaturize the metallographic structure of the press-bonded ball after it is melted and solidified. As a result, when a FAB is bonded onto an electrode pad through compression deformation, it is less affected by the anisotropic deformation of each crystal grain due to the size of the crystal grain being miniaturized. Thus, the roundness of the press-bonded ball is improved because the press-bonded ball deforms isotropically to the compressional axis.

Pr is the most suitable element among Ca and rare earth elements to achieve the object of the present invention because it has a high additive efficiency with respect to strength and has a small effect on the shape of the press-bonded ball. The compositional range of Pr to balance the strength and the shape of the press-bonded ball is 0.0016% or more by mass but 0.02% or less by mass. Adding up to 0.02% by mass of Pr enables robust press-bonding. Specifically for fine pitch connection such as for 35-60 μm electrode pad pitch that is expected to become a mainstream in the future, adding Pr in a concentration of 0.0016% or more by mass but 0.0079% or less by mass, i.e., in a lower concentration than that of other elements, still ensures enough strength to be obtained. Combined addition of Pr with any one or more of Ti, V, Cr, Hf, Nb, W, Zr, Pd and Be, specifically with Ti and V enables the production of a bonding wire whose press-bonded shape is remarkably excellent.

The present invention is specifically advantageous to a high-strength and high-elasticity bonding wire that contains more than 0.005% by mass of Ca and rare earth elements as an additive amount so that the roundness of the press-bonded ball is difficult to maintain. As the additive amount of Ca and rare earth elements increases, a resultant bonding wire becomes more susceptible to oxidation, and thus it is desirable to use such elements that are effective to improve the mechanical properties with the least possible additive amount thereof. Among those elements, the ones which have the mechanical property improvement effect comparable to Pr, are Ca, La, Ce, Nd and Sm. Ca, like Pr; is the element which helps improve the mechanical property, yet has a smaller mass number compared to rare earth elements so that addition of the same amount by mass of Ca as rare earth elements causes the atomic concentration of Ca to be higher. It is desirable that the Ca content is 0.0025% or less by mass in the case that Ca is used to combine with rare earth elements and their total amount exceeds 0.005% by mass. In the case of La, Ce, Pr, Nd, and Sm, they may be added alone in the additive amount exceeding 0.005% by mass.

Although Pd is not so effective as the above-mentioned refractory elements: Ti, V, Cr, Hf, Nb, W, and Zr, it improves roundness of a press-bonded ball at the time of press-bonding. Compared to these refractory elements, Pd is a less oxidizable element, so that bondability does not deteriorate even if it is added in large amounts. Furthermore, adding a large amount of Pd has a secondary effect of improving reliability at the high temperature because it inhibits the production of an intermetallic compound formed by reacting aluminum of electrode pad material and gold. Since Pd is less oxidizable element, it is possible to add Pd in larger amounts than the above-mentioned elements, preferably in a range of at least 0.001% by mass but not more than 2% by mass according to the present invention. As a rough measure, Pd may be added until it reaches about the same level as the total concentration of Ca and rare earth elements, preferably at least half the total concentration. Addition of Pd inhibits the growth of the intermetallic compound between an aluminum electrode and a gold wire as well as the production of voids under the post-bonding high-temperature use environment in a range of from 100C° to 250C°, increasing high-temperature reliability. If the additive amount of Pd exceeds 2% by mass, however, the hardness of a FAB increases, and thus, a semiconductor chip below an electrode pad is more likely to be damaged at the time of the first bonding. For this reason, the additive amount of Pd should be 2% by mass at maximum.

Be improves the roundness of the press-bonded ball although it has a different mechanism than the above-mentioned group of elements. Be is the element that increases deformation resistance, specifically highly effective in keeping a diameter of a press-bonded ball from extending in the ultrasonic wave applying direction by the application of ultrasonic waves at the time of wire bonding. Thus, by using this effect together, there can be obtained a larger effect of improving the roundness of press-bonded ball. This effect can be obtained if Be is added in an amount of 0.0002% or more by mass. Be, however, is an easily oxidizable element, having a large rate of diffusion so that oxides are easily formed on the surface of a FAB. As a result, the bondability of the second bonding is sometime deteriorated. Also, Be is liable to form an oxide on the surface of the FAB when forming the FAB at the time of wire bonding. From this perspective, the additive amount of Be is preferably 0.0011% or less by mass. If in this range, then the above-mentioned advantages will become particularly beneficial to the first bonding. The effectiveness of Be in the improvement of the roundness of the press-bonded ball is similar to that of Ti, V, Cr, Hf, Nb, W and Zr, but due to the different mechanisms between Be and the others, the effectiveness can be still greater when Be is added together with at least one of Ti, V, Cr, Hf, Nb, W and Zr.

Adding any other elements that are not mentioned in the present invention is not specifically limited, but it is desirable to add them in the least possible amounts because they generally make a bonding wire or the surface of a FAB susceptible to oxidation at the time of wire bonding. Nevertheless, as for platinum group elements such as Pt, Rh, Ru, Os and Ir; precious metals such as Cu and Ag; and Mo, Mn, etc., they may be contained because they do not promote an oxidization of a bonding wire so much. Up to 2% by mass of platinum group elements, up to 1% by mass of Cu or Ag, or up to 0.1% by mass of Mo or Mn are allowed to be added. Likewise, as for In, Ga and Ni as well, deterioration in bondability due to oxidation does not occur if they are contained in a mass content of 0.005% or less by mass, which, depending on wire bonding conditions, will have an effect of improving strength of the first bonding.

In order to obtain a bonding wire having still higher strength and elasticity, addition of the foregoing elements will not suffice, and wire drawing at high reduction rate is necessary. Wire drawing at high reduction rate allows large strains to be accumulated within a bonding wire, and the wire strength is allowed to increase, and crystal grains are <111>-oriented along the wire drawing direction, so that high Young's modulus can be obtained. The wording "<111>-oriented" referred to here denotes a deformation texture, a polycrystal obtained by severe working. For isotropic polycrystalline gold whose crystalline orientation is random, Young's modulus is supposed to be approximately 81 GPa. However, as crystals become <111>-oriented along the direction of wire drawing, the Young's modulus in the longitudinal direction of the bonding wire becomes higher than this value, thus representing a reference index of degree of orientation. In the present invention, the Young's modulus, which is practically important, is employed as a reference index of crystalline orientation, instead of a crystallographic index.

For a typical bonding wire of about 4% breaking elongation, the Young's modulus of 85 GPa or more is obtained by adding 0.001% or more by mass of Ca and rare earth elements in total concentrations and severe or strong working of a 99.8% or more work rate. In the case that the total concentration of Ca and rare earth elements exceeds 0.005% by mass, application of such strong wire drawing of 99.8% or more work rate enables the production of a high-elasticity bonding wire which can keep its Young's modulus at 85 GPa or more until its breaking elongation becomes 10%. Such high-elasticity bonding wire suppresses a wire sweep at the time of resin encapsulation, thus enabling the distance between bonding wires to be narrowed at the time of mounting, being advantageous to making the pitch of electrode pads narrower.

Moreover, through such strong working, a texture within a bonding wire is structurally refined, and fibrous textures of 1 μm or less are allowed to appear in the radial direction of the bonding wire. Thus, axial symmetry with respect to the radial direction of the bonding wire is obtained to thereby improve the linearity of the bonding wire.

The "work rate" referred to here is a value calculated using the formula: $(A_0-A_1)/A_0 \times 100(\%)$ wherein $A_0$ denotes a cross-sectional area of an ingot that is in a casting state or after undergoing process annealing; and $A_1$ denotes a final wire diameter. The term "process annealing" means a heat treatment for recrystallization performed in the middle of a drawing process. This process may be performed in a rod or wire state, but in the present invention, this intermediate material is also broadly referred to as "ingot". The "process annealing" referred to here is a heat treatment where temperature of material reaches substantially 400° C. or more and this temperature is kept for 1 minute or more, unlike an annealing which removes wire curl and eliminates slight strains for adjusting breaking elongation in a final step.

Even if the same composition is added in the same amount, a resultant shape of a press-bonded ball is affected by the degree of the orientation of the bonding wire. For such a strongly <111>-oriented bonding wire as having more than 85 GPa Young's modulus in the longitudinal direction, the effect of adding Ti, V, Cr, Hf, Nb, W, Zr or Pd on the roundness of a press-bonded ball is large.

Such strongly <111>-oriented bonding wire having more than 85 GPa Young's modulus in the longitudinal direction is defined as a bonding wire whose crystal grains that are substantially <111>-oriented along the longitudinal direction of a wire material make up 50% or more in terms of a cross sectional area. The term "<111>-oriented crystal grains" referred to here is defined as the crystal grains one of the (111) surface normals of which has inclination angle of 15° or less relative to the longitudinal direction (the wire drawing direction) of the bonding wire. In other words, for the bonding wire whose crystal grains, which are substantially <111>-oriented along the longitudinal direction, make up 50% or more in terms of a cross-sectional area, the effect of adding Ti, V, Cr, Hf, Nb, W, Zr, or Pd is great.

Any of Ti, V, Cr, Hf, Nb, W, Zr and Pd may be used as long as the total concentration thereof is within the predetermined concentration range. Also, any of these elements may be selectable according to a required loop shape and a usage environment. However, combination of elements that achieves high strength and Young's modulus as well as high roundness of a press-bonded ball in the least possible additive amount is the combined addition of Pr, Ca, and Be to at least one of Ti and V in the above-mentioned concentration ranges

EXAMPLES

Next is a detailed description of the present invention based on examples, which are only shown by way of example, and the invention is not limited by the examples.

First Example

Samples of bonding wires containing 0.001% by mass of Ca or 0.001% by mass of La were prepared to study the effect of adding Ti and V.

The above amount of Ca or La was added to a gold material having a purity of 99.9998% or more by mass, and cast into ingots of 5 mm in diameter and 100 mm in length. Likewise, another material was also prepared by adding 0.001% by mass of Ti or V to these elements. After the casting, the composition of each sample was analyzed, and it was confirmed that the Si content was 0.001% or less by mass, and the contents of Ca, rare earth elements, Pb, Sn, Li and Na other than the addition elements were 0.0002% or less by mass.

Then, the ingots were each rolled to about 2 mm square using a groove rolling device, and drawn to a 0.56 mm in diameter using diamond dies. Subsequently, they were allowed to undergo process annealing at 400° C. for 10 minutes in Ar atmosphere. After that, it was drawn to a 25 μm in diameter at 10 m/min using the diamond dies in a lubricating liquid. In the drawing process, a reduction in area per each passage through the die was about 12%, and a reduction in cross-sectional area was 99.8% as compared to the ingot in the process annealing. Thereafter, heat treatment (thermal refining) was continuously performed using a tubular furnace in Ar atmosphere, and then a tensile test of the bonding wire was performed at varying temperatures to adjust a breaking elongation and thus measured breaking strength, breaking elongation, and Young's modulus in the longitudinal direction. Table 1 shows the mechanical characteristic and shape of the press-bonded ball concerning the bonding wire prepared in accordance with the first example.

TABLE 1

| SAMPLE NUMBER | ELEMENTAL CONTENT (mass ppm) | PREDETERMINED ELONGATION (%) | STRENGTH (MPa) | YOUNG'S MODULES (GPa) | DEFECTIVE FRACTION OF THE PRESS-BONDING BALL (%) | REMARKS |
|---|---|---|---|---|---|---|
| 1 | Ca: 10 | 2 | 302 | 85.2 | 6.9 | COMPARATIVE |
|   | THE BALANCE: Au | 3 | 240 | 85.9 | 7.1 | EXAMPLE |
|   |   | 4 | 230 | 85.0 | 5.9 |   |
|   |   | 5 | 220 | 83.7 | 3.3 |   |
|   |   | 6 | 215 | 82.5 | 2.8 |   |
| 2 | Ca: 10 | 2 | 304 | 85.7 | 2.8 | EXAMPLE |
|   | Ti: 10 | 3 | 241 | 86.0 | 2.9 |   |
|   | THE BALANCE: Au | 4 | 231 | 85.0 | 2.5 |   |
|   |   | 5 | 220 | 83.8 | 2.4 |   |
|   |   | 6 | 215 | 82.5 | 2.3 |   |
| 3 | La: 10 | 2 | 284 | 85.1 | 6.5 | COMPARATIVE |
|   | THE BALANCE: Au | 3 | 231 | 85.8 | 7.1 | EXAMPLE |
|   |   | 4 | 210 | 83.5 | 3.2 |   |
|   |   | 5 | 201 | 82.0 | 2.1 |   |
| 4 | La: 10 | 2 | 285 | 85.3 | 2.7 | EXAMPLE |
|   | V: 5 | 3 | 231 | 85.9 | 2.9 |   |
|   | THE BALANCE: Au | 4 | 211 | 83.6 | 2.7 |   |
|   |   | 5 | 201 | 82.1 | 2.1 |   |

The Young's modulus of the bonding wire increased as the thermal refining temperature increased, and became higher than that of the drawn bonding wire. However, it reached a peak for the thermal refining temperature, and then, when the predetermined elongation was about 3% or more, it decreased as the predetermined elongation, i.e., the thermal refining temperature increased. The fact that an isotropic polycrystalline gold with random crystalline orientation has the Young's modulus of approximately 81 GPa demonstrates that all the bonding wires in Table 1 were oriented to <111>. The reason why the Young's modulus decreased with the increase of the thermal refining temperature is that recrystallization of the bonding wire caused crystal rotation, leading to the reduced degree of <111> orientation.

For the bonding wires containing 0.001% by mass of Ca, the Young's modulus was 85 GPa or more at the predetermined elongation of 4% or less (sample number 1), while for those containing 0.001% by mass of La, the Young's modulus was 85 GPa or more at the predetermined elongation of 3% or less (sample number 3), each showing particularly large degree of <111> orientation. For the bonding wires comprised of the above elements and 0.001% by mass of Ti or 0.0005% by mass of V, both the strength and the Young's modulus increased slightly, but there could not be perceived any substantial differences (sample numbers 2 and 4).

Analysis of crystal orientations in section areas of the bonding wires having the Young's moduli of 85 GPa or more were performed by EBSD (Electron Back Scatter Diffraction Patterns). As a result, it was found that the crystal grains one of the <111> surface normals of which was inclined at an angle of 15° or less to the longitudinal direction of the bonding wire made up 50% or more in terms of cross-sectional area, and that the crystal grains were highly <111>-oriented along the longitudinal direction of the bonding wire.

Wire bonding tests were performed using semiconductor chips pad electrodes of which were made of aluminum, having 70 μm pitch distance. Wire bonding was performed using 8028-pps made by K&S Inc, under the following configurations: 52 μm press-bonding diameter in the first bonding; 90 μm loop height from the electrode pad; and 1.5 mm loop length. The wire bonding was carried out in the atmosphere at 150° C. chip surface temperature.

Evaluation of bondability was carried out by measuring a defective fraction of the press-bonded balls. For a criterion for defective press-bonded ball, press-bonding diameters in the first bonding area were measured both in a ultrasonic waves applying direction and in a direction perpendicular thereto, and then balls whose press-bonding diameters in the perpendicular direction divided by the press-bonding diameters in the ultrasonic waves applying direction exceeded 1.1, and balls with recessed shapes in press-bonding peripheral edges when viewed from the first bonding direction at the time of the wire bonding, were determined to be defective balls. The number of the defective balls divided by a total number of observations was defined as the defective fraction of the press-bonded balls. In the present example, the total number of observations of the press-bonded balls was 1000. The results of the evaluation of the wire bonding are shown in Table 1.

In the bonding wires to which was added either 0.001% by mass of Ca or 0.001% by mass of La alone, the Young's modulus was correlated with the defective fraction of the press-bonded balls. Specifically, in the bonding wires having the Young's modulus of 85 GPa or more, the roundness of the press-bonded ball was low (sample numbers 1 and 3). On the other hand, in the bonding wires containing 0.001% by mass of Ca and 0.001% by mass of Ti, or 0.001% by mass of La and 0.0005% by mass of V, the roundness of the press-bonded ball was improved at all the predetermined elongations (sample numbers 2 and 4), in which the improvement of the roundness was particularly noticeable in the bonding wires having 85 GPa or more Young's modulus.

From the above results, it was verified that in the cases that Ti or V is added in addition to Ca or La, the roundness of the press-bonded ball is improved specifically for the bonding wires having the Young's modulus of 85 GPa or more causing a high degree of <111> orientation. In other words, it was demonstrated that adding Ti or V is effective in improving the roundness of press-bonded ball, if the crystal grains one of the normals to the (111) surface of which was inclined at an angle of 15° or less to the longitudinal direction of the bonding wire makes up 50% or more in terms of cross-sectional area.

Second Example

For studying the effect of Ca or rare earth elements on the press-bonding shape, the bondability was examined in a fixed range of the Ti content from 0.0015 to 0.004% by mass, depending on the additive amount of Ca or rare earth elements.

Cast ingots of 6 mm diameter were prepared by adding the predetermined elements to the gold material used in the first example. Then, the ingots were rolled to about 2 mm square using a groove rolling device, and drawn to a 23 μm in diameter using a diamond dies in a lubricating liquid. In the drawing process, a reduction in area per each passage through the die was about 10%, and the work rates of the bonding wires were 99.8%. Thereafter, heat treatment (thermal refining) was continuously performed using a tubular furnace in Ar atmosphere, and then a tensile test of the bonding wires was performed at varying temperatures to adjust the breaking elongation as the breaking elongations were adjusted to 4%

The bonding test was performed using UTC-400 made by Shinkawa Ltd. The first bonding was performed on an Al—Cu electrode at a semiconductor chip side while a wedge bonding (the second bonding) was performed on a silver plating electrode at a 42 alloy side. The ball bonding was performed at 60 μm pitch distance of the electrode pad in the first bonding area, while adjusting the diameter of the press-bonded ball to approximately 44 μm. The wire span was approximate 1.5 mm, and the loop height from the electrode pad was 90 μm. The bonding was carried out in the atmosphere, and the bonding temperature was set at 150° C.

Evaluation of bondability was carried out, in the same manner as in the first example, by measuring a defective fraction of the press-bonded balls. For a criterion for defective press-bonded ball, press-bonding diameters in the first bonding area were measured both in a ultrasonic waves applying direction and in a direction perpendicular thereto, and then balls whose press-bonding diameters in the perpendicular direction divided by the press-bonding diameters in the ultrasonic waves applying direction exceeded 1.1, and balls with recessed shapes in press-bonding peripheral edges when viewed from the first bonding direction at the time of the bonding, were determined to be defective balls. The number of the defective balls divided by a total number of observations was defined as the defective fraction of the press-bonded balls.

Table 2 shows the mechanical characteristic and defective fraction of the press-bonded balls for the bonding wires of 4% predetermined elongation prepared in accordance with the second example.

TABLE 2

| SAMPLE NUMBER | COMPONENTIAL ANALYSIS VALUE (mass ppm) | | | | | | | | | | | STRENGTH (MPa) | YOUNG'S MODULES (GPa) | DEFECTIVE FRACTION OF THE PRESS-BONDING BALL (%) | REMARKS |
|---|---|---|---|---|---|---|---|---|---|---|---|---|---|---|---|
| | Ca | La | Ce | Pr | Nd | Sm | Ho | Tm | Yb | Y | Ti | Au | | | | |
| 5 | 62 | | | | | | | | | | 34 | THE BALANCE | 302 | 90.0 | 9.8 | EXAMPLE |
| 6 | | 78 | | | | | | | | | 35 | THE BALANCE | 300 | 90.3 | 7.7 | EXAMPLE |
| 7 | | | 66 | | | | | | | | 36 | THE BALANCE | 300 | 91.0 | 4.5 | EXAMPLE |
| 8 | | | | 58 | | | | | | | 35 | THE BALANCE | 301 | 91.4 | 1.7 | EXAMPLE |
| 9 | | | | | 68 | | | | | | 35 | THE BALANCE | 299 | 91.1 | 4.1 | EXAMPLE |
| 10 | | | | | | 74 | | | | | 36 | THE BALANCE | 300 | 90.8 | 5.3 | EXAMPLE |
| 11 | | | | | | | 150 | | | | 34 | THE BALANCE | 299 | 90.0 | 40.4 | EXAMPLE |
| 12 | | | | | | | | 200 | | | 35 | THE BALANCE | 280 | 88.0 | 86.1 | EXAMPLE |
| 13 | | | | | | | | | 200 | | 35 | THE BALANCE | 220 | 85.0 | 80.8 | EXAMPLE |
| 14 | | | | | | | | | | 200 | 35 | THE BALANCE | 220 | 83.0 | 90.2 | EXAMPLE |
| 15 | | | | 16 | | | | | | | 15 | THE BALANCE | 242 | 86.5 | 1.8 | EXAMPLE |
| 16 | 16 | | | | | | | | | | 16 | THE BALANCE | 240 | 86.0 | 2.0 | EXAMPLE |
| 17 | | 15 | | | | | | | | | 15 | THE BALANCE | 230 | 85.5 | 1.9 | EXAMPLE |
| 18 | | | | 79 | | | | | | | 40 | THE BALANCE | 342 | 93.0 | 7.8 | EXAMPLE |
| 19 | 80 | | | | | | | | | | 39 | THE BALANCE | 340 | 92.5 | 11.2 | EXAMPLE |
| 20 | | | 80 | | | | | | | | 41 | THE BALANCE | 338 | 91.5 | 8.4 | EXAMPLE |

It was found that the additive amount of Pr required to obtain the strength of 300 MPa was the least among those of Ca and rare earth elements. Addition of low-atomic-number rare earth elements, particularly Pr, had a high efficiency to improve the strength. As for Tm, Yb, and Y, the strength of 300 GPa could not be obtained even by adding as much as 0.02% by mass thereof. In the cases that the same amount of Ti was added, the smaller the additive amount of the elements was, the lower the defective fraction of the resultant shapes of the press-bonded balls was. This is because the amount of oxides produced on the surface of the FAB was small. While Ca has the second greatest effect on strength per unit additive mass after Pr, it exhibited the high defective fraction of the press-bonded ball shape, which is presumably because its additive amount is large in terms of atomic weight.

In the case that necessary strength level of the bonding wire was low, it was confirmed that adding up to 0.02% or less by mass of Tm, Yb, or Y allowed for the wire bonding. However, when used for the cases that necessary strength level of the bonding wire is high, using Pr, Ca, La, Ce, Pr, Nd or Sm would be preferable. Among the components tested this time, it was found that addition of Pr has the comparatively great effect on the strength and thus the addition of Pr leads to better press-bonding shapes as compared to the others of the same strength. Specifically, the effect of addition of Pr was great in the range from 0.0015 to 0.0079% by mass (sample numbers 15 and 18).

Third Example 0.004% by mass of Pr and 0.0015% by mass of Ca were added to the gold material used in the first example. Then, at lease one of Ti, V, Cr, Hf, Nb, W, Zr, Pb, Li, Sn, Sr, Co and Si was added thereto to prepare samples. Then, those samples were evaluated on their press-bonding shapes.

Samples of the bonding wires were prepared in the same manner as the first example, but the final diameters thereof were set at 20 μm. After casting, the composition of each sample was analyzed, and it was confirmed that the contents of alkali metal elements, alkaline earth metal elements, rare earth metal elements and transition metal elements other than the addition elements were 0.0002% or less by mass.

In the sampled systems prepared by adding 0.004% by mass of Pr and 0.0015% by mass of Ca, the Young's modulus was over 85 GPa at the predetermined elongations of 10% or less. The breaking elongation of the bonding wires to be evaluated on bondability was fixed to 5%.

The Young's modulus of the bonding wire samples for evaluation reached about 90 GPa. Examination of the textures thereof by EBSD analysis revealed that they were formed with polycrystalline fibrous texture extending from about 0.1 to 0.5 μm in the wire diameter direction thereof and from about 0.5 to several tens μm in the longitudinal direction thereof, and that most of the crystal grains thereof were <111> oriented along the longitudinal direction of the bonding wires. That is why the Young's moduli were so high.

The bonding test was performed using UTC-400 made by Shinkawa Ltd. The first bonding was performed on an Al—Cu electrode at a semiconductor chip side while a wedge bonding (the second bonding) was performed on a silver plated electrode at a 42 alloy side. The ball bonding was performed at 50 μm pitch distance of the electrode pad in the first bonding area, while adjusting the diameter of the press-bonded ball to approximately 38 μm. The wire span was approximate 1.5 mm, and the loop height from the electrode pad was 90 μm. The bonding was carried out in the atmosphere, and the bonding temperature was set at 150° C.

Evaluation of bondability was carried out, in the same manner as in the first example, by measuring a defective fraction of the press-bonded balls. For a criterion for defective press-bonded ball, press-bonding diameters in the first bonding area were measured both in a ultrasonic waves applying direction and in a direction perpendicular thereto, and then balls whose press-bonding diameters in the perpendicular direction divided by the press-bonding diameters in the ultrasonic waves applying direction exceeded 1.1, and balls with recessed shapes in press-bonding peripheral edges when viewed from the first bonding direction at the time of the bonding, were determined to be defective balls. The number of the defective balls divided by a total number of observations was defined as the defective fraction of the press-bonded balls. The total number of the observations was 1,000. Table 3 shows the mechanical characteristics and the defective fraction of the press-bonded balls in the bonding wires of the 5% predetermined elongation prepared in accordance with the third example.

TABLE 3

| SAMPLE NUMBER | COMPONENTIAL ANALYSIS VALUE (mass ppm) | | | | | | | | | | | | | | | |
|---|---|---|---|---|---|---|---|---|---|---|---|---|---|---|---|---|
| | Pr | Ca | Ti | V | Cr | Hf | Nb | W | Zr | Pb | Li | Sn | Sr | Co | Si | Au |
| 21 | 40 | 15 | | | | | | | | | | | | | | THE BALANCE |
| 22 | 41 | 14 | 7 | 7 | | | | | | | | | | | | THE BALANCE |
| 23 | 39 | 14 | 15 | 14 | | | | | | | | | | | | THE BALANCE |
| 24 | 40 | 15 | 30 | 25 | | | | | | | | | | | | THE BALANCE |
| 25 | 40 | 15 | 60 | 42 | | | | | | | | | | | | THE BALANCE |
| 26 | 41 | 15 | | | 30 | | | | | | | | | | | THE BALANCE |
| 27 | 40 | 14 | | | 61 | | | | | | | | | | | THE BALANCE |
| 28 | 40 | 15 | | | | 29 | | | | | | | | | | THE BALANCE |
| 29 | 41 | 16 | | | | 80 | | | | | | | | | | THE BALANCE |
| 30 | 41 | 15 | | | | | 31 | | | | | | | | | THE BALANCE |
| 31 | 40 | 15 | | | | | 95 | | | | | | | | | THE BALANCE |
| 32 | 39 | 14 | | | | | | 30 | | | | | | | | THE BALANCE |
| 33 | 41 | 15 | | | | | | 90 | | | | | | | | THE BALANCE |
| 34 | 40 | 15 | | | | | | | 30 | | | | | | | THE BALANCE |
| 35 | 41 | 14 | | | | | | | 71 | | | | | | | THE BALANCE |
| 36 | 40 | 15 | | | | | | | | 30 | | | | | | THE BALANCE |
| 37 | 39 | 15 | | | | | | | | | 29 | | | | | THE BALANCE |
| 38 | 40 | 15 | | | | | | | | | | 30 | | | | THE BALANCE |
| 39 | 40 | 14 | | | | | | | | | | | 31 | | | THE BALANCE |
| 40 | 39 | 16 | | | | | | | | | | | | 29 | | THE BALANCE |
| 41 | 40 | 15 | | | | | | | | | | | | | 31 | THE BALANCE |

| SAMPLE NUMBER | STRENGTH (MPa) | YOUNG'S MODULES (GPa) | DEFECTIVE FRACTION OF THE PRESS-BONDING BALL (%) | REMARKS |
|---|---|---|---|---|
| 21 | 282 | 89.2 | 30.5 | COMPARATIVE EXAMPLE |
| 22 | 283 | 89.3 | 4.8 | EXAMPLE |
| 23 | 285 | 90.0 | 2.8 | EXAMPLE |
| 24 | 286 | 90.2 | 2.6 | EXAMPLE |
| 25 | 286 | 89.8 | 13.6 | COMPARATIVE EXAMPLE |
| 26 | 284 | 90.2 | 3.6 | EXAMPLE |
| 27 | 285 | 90.0 | 6.9 | EXAMPLE |
| 28 | 285 | 89.2 | 3.7 | EXAMPLE |
| 29 | 287 | 90.4 | 8.6 | EXAMPLE |

TABLE 3-continued

| | | | | |
|---|---|---|---|---|
| 30 | 284 | 89.8 | 3.7 | EXAMPLE |
| 31 | 287 | 90.5 | 9.6 | EXAMPLE |
| 32 | 285 | 89.7 | 3.6 | EXAMPLE |
| 33 | 288 | 90.2 | 9.7 | EXAMPLE |
| 34 | 284 | 89.5 | 3.6 | EXAMPLE |
| 35 | 288 | 89.9 | 7.9 | EXAMPLE |
| 36 | 284 | 89.0 | 36.8 | COMPARATIVE EXAMPLE |
| 37 | 282 | 88.8 | 39.5 | COMPARATIVE EXAMPLE |
| 38 | 284 | 90.5 | 37.5 | COMPARATIVE EXAMPLE |
| 39 | 303 | 89.2 | 41.7 | COMPARATIVE EXAMPLE |
| 40 | 281 | 89.3 | 32.5 | COMPARATIVE EXAMPLE |
| 41 | 290 | 89.2 | 22.4 | COMPARATIVE EXAMPLE |

The strength of the bonding wire samples of 5% predetermined elongation where 0.0055% by mass of Ca and Pr was added in total, reached 280 MPa or more, and the Young's modulus thereof reached 89 GPa or more. However, for the samples where only Ca and Pr were added (sample number 21), the defective fraction of the press-bonded balls reached as much as about 30% under the present wire bonding conditions.

On the other hand, for the samples where total 0.001% or more by mass of one or more of Ti, V, Cr, Hf, Nb, W and Zr was added in addition to Ca and Pr (sample numbers 22, 23, 24, 26-35), the defective fraction of the press-bonded ball shape was reduced to 1/3 or less.

As for the samples where one or more of Ti, V, Cr, Hf, Nb, W and Zr was/were further added, specifically for those where total 0.003% by mass of one or more of Ti, V, Cr, Hf, Nb, W and Zr was/were further added (sample numbers 23, 26, 28, 30, 32, 34), the defective fraction of the press-bonded ball was reduced to approximately 1/10. Specifically, the defective fraction of press-bonded ball was low in the sample where Ti and V were added (sample number 23).

The reason why the shape of the press-bonded ball was deteriorated in the sample where total more than 0.01% by mass of Ti and V was added (sample number 25), is that a depression caused by a shrinkage cavity formed at the edge of a FAB prior to the press-bonding operation became large after an electric discharge to form the FAB.

For comparison, the samples where 0.003% by mass of Pb, Li, Sn, Sr, Co or Si was further added were also examined (sample numbers 36-41), revealing that the shape of the press-bonded ball was slightly improved in the sample where Si was further added, but no significant improvement in the shape of the press-bonded ball was found compared to the those where Ti, V, Cr, Hf, Nb, W, or Zr was further added.

Forth Example

Next, the effect of Pr addition was studied.

0.004% by mass of Pr, 0.001% by mass of Ca and 0.004% by mass of Hf were added to the gold material used in the first example. Then, Pd was further added thereto to prepare the bonding wire sample, which was evaluated on the shape of the press-bonded ball.

The preparation of the bonding wires and the evaluation of bondability thereof were performed in the same way as the third example.

In the samples where 0.004% by mass of Pr and 0.001% by mass of Ca were added, the Young's modulus was more than 85 GPa at the predetermined elongations of 9% or less. The breaking elongation of the bonding wires subjected to the evaluation of bondability was fixed to be 5%.

Table 4 shows the mechanical characteristics and the defective fraction of the press-bonded ball for the bonding wires of the 5% predetermined elongation prepared in accordance with the forth example.

TABLE 4

| SAMPLE NUMBER | COMPONENTIAL ANALYSIS VALUE (mass ppm) | | | | | STRENGTH (MPa) | YOUNG'S MODULES (GPa) | DEFECTIVE FRACTION OF THE PRESS-BONDING BALL (%) | REMARKS |
|---|---|---|---|---|---|---|---|---|---|
| | Pr | Ca | Hf | Pd | Au | | | | |
| 42 | 39 | 11 | | | THE BALANCE | 275 | 88.1 | 20.2 | COMPARATIVE EXAMPLE |
| 43 | 40 | 11 | 39 | | THE BALANCE | 276 | 88.1 | 8.6 | EXAMPLE |
| 44 | 40 | 10 | 40 | 25 | THE BALANCE | 275 | 88.0 | 6.9 | EXAMPLE |
| 45 | 40 | 9 | 41 | 50 | THE BALANCE | 278 | 88.8 | 3.5 | EXAMPLE |
| 46 | 39 | 11 | 40 | 1050 | THE BALANCE | 287 | 89.8 | 3.0 | EXAMPLE |
| 47 | 40 | 10 | 40 | 10500 | THE BALANCE | 288 | 90.2 | 6.0 | EXAMPLE |

Press-bonding shape improvement effect could be seen when 0.004% by mass of Hf was added to the system containing 0.004% by mass of Pr and 0.001% by mass of Ca (sample number 43). In systems (sample numbers 44-47) where Pd was further added to the above-mentioned system, further improvement effect with respect to the press-bonding shape was seen. Specifically, the excellent press-bonding shape was seen in the samples Pd concentration of which was as high as 0.005% or more by mass (sample number 45). Even in the bonding wire samples where 1% by mass of Pd was added (sample number 47), the excellent shape of the press-bonded ball was maintained. Pd is less oxidizable element as compared to Ti, V, Cr, Hf, Nb, W and Zr, so that Pd is suitable for use in combination with these elements, and it is possible to add in a large amount.

Fifth Example

Furthermore, the effect of adding Be to the bonding wires containing the composition of the invention on the bondability thereof was studied. Studied therein was the system containing approximately 0.0045% by mass of Pr and approximately 0.001% by mass of La that were added to improve the strength and the Young's modulus.

Necessary quantities of Pr, La, Ti, Be, and Pd were added to the gold material of a purity of 99.9998% or more by mass, and cast into ingots of 5 mm in diameter and 100 mm in length. After the casting, the composition of each sample was analyzed, and it was confirmed that the contents of Ca, rare earth elements, Pb, Sn, Li and Na other than the addition elements were 0.0002% or less by mass.

Then, the ingots were each rolled to about 2 mm square using a groove rolling device, and drawn to a 23 μm in diameter using a diamond dies in a lubricating liquid. In the drawing process, a reduction in area per each passage through the die was about 12%. Thereafter, heat treatment (thermal refining) was continuously performed using a tubular furnace in Ar atmosphere, and thus the bonding wire samples were prepared while varying temperatures to adjust a breaking elongation to 4%. The reduction in cross-section area amounted to 99.54% compared to that of the ingot.

The breaking strength, the Young's modulus in the longitudinal direction, and the bondability were evaluated. In the system containing approximately 0.0045% by mass of Pr and approximately 0.001% by mass of La, the Young's modulus was 85 GPa or more in all the ranges where the breaking elongation was adjusted to 10% or less.

The Young's moduli of the bonding wire samples breaking elongations of which were adjusted to 4% reached 90 GPa or more. Examination of the textures thereof by EBSD analysis revealed that they were formed with polycrystalline fibrous texture extending from about 0.1 to 0.5 μm in the wire diameter direction thereof and from about 0.5 to several tens μm in the longitudinal direction thereof, and that most of the crystal grains thereof were <111> oriented along the longitudinal direction of the bonding wires. That is why the Young's moduli were so high.

The bonding test was performed using UTC-400 made by Shinkawa Ltd. As a capillary was used T0-11-9SA made by TOTO Ltd. A semiconductor chip of 480 μm height was connected with a 42 alloy lead frame, using the above-mentioned bonding wires. The first bonding was performed on an Al electrode at the semiconductor chip side while a wedge bonding (the second bonding) was performed on a silver plated electrode at the 42 alloy side. The average diameter of the press-bonded balls was adjusted to approximately 45 μm. The wire span was 5 mm, and the loop height from the electrode pad was 85 μm. The bonding was carried out in the atmosphere, and the bonding temperature was set at 150° C.

The bondability was evaluated using the following evaluation items: a fraction of petal-like defects where a concave portion appear in the peripheral outer edge of the press-bonding ball as viewed from thereabove, i.e., petal-like defect rate calculated by obtaining the sum of the number of bondings where the ratio (Y/X) of the press-bonding diameter in the ultrasonic waves applying direction (Y direction) to the press-bonding diameter in the direction perpendicular thereto (X direction) exceeded 1.1 and the number of bondings where the petal-like defect occurred, then dividing the sum by a total number of the bondings; a deviation of average values of the press-bonding diameters in the ultrasonic wave applying direction (Y direction) and the direction perpendicular thereto (X direction) (standard deviation); a shear strength of the press-bonded ball indicating the bonding strength of the first bonding and the second bonding; and a peel strength of the second bonding. The total number of the bondings was 1,000.

The shear strength of the press-bonded ball was measured by moving a tool parallel to an electrode pad at a 1 μm height from the electrode pad and then shearing off the press-bonded ball. The second-peel strength was measured by removing the first bonding portion in advance, then seizing a part of the second bonding portion by a 1 mm length at the press-bonded ball side and peeling it off from the second bonding area. The number of measurements of the shear strength was 200.

Table 5 shows that the mechanical characteristics and the evaluation results of the bonding wires of 4% predetermined elongation prepared in accordance with the fifth example.

TABLE 5

| SAMPLE NUMBER | COMPONENTIAL ANALYSIS VALUE (mass ppm) | | | | | | GOLD WIRE MECHANICAL CHARACTERISTIC | | BONDABILITY | |
|---|---|---|---|---|---|---|---|---|---|---|
| | Pr | La | Ti | Pd | Be | Au | STRENGTH (MPa) | YOUNG'S MODULES (GPa) | FRACTION OF THE PETAL-LIKE DEFECT (%) | ANISOTROPY (Y/X) |
| 48 | 45 | 10 | | | | | 317 | 91.2 | 18.3 | 1.07 |
| 49 | 44 | 9 | 30 | | | | 319 | 91.0 | 1.6 | 1.04 |
| 50 | 45 | 8 | 31 | | 2 | | 319 | 91.1 | 1.3 | 1.01 |
| 51 | 44 | 10 | 30 | | 7 | | 320 | 91.5 | 0.3 | 1.00 |
| 52 | 46 | 8 | 29 | | 9 | | 321 | 90.4 | 0.3 | 0.99 |
| 53 | 45 | 9 | 32 | | 11 | | 321 | 91.0 | 0.4 | 1.00 |
| 54 | 44 | 8 | 30 | 500 | 7 | | 319 | 90.5 | 0.2 | 0.99 |
| 55 | 45 | 10 | 30 | 1000 | 6 | | 325 | 91.5 | 0.0 | 1.00 |
| 56 | 45 | 9 | 32 | 9500 | 7 | | 335 | 91.8 | 0.1 | 1.00 |

TABLE 5-continued

BONDABILITY

| SAMPLE NUMBER | DEFECTIVE FRACTION OF THE PRESS-BONDING BALL (%) | STANDARD DEVIATION OF DIAMETER (μm) | SHEAR STRENGTH OF THE PRESS-BONDING BALL (MPa) | PEEL STRENGTH OF THE SECOND BONDING (mN) | REMARKS |
|---|---|---|---|---|---|
| 48 | 32.6 | 0.97 | 87.1 | 86.0 | COMPARATIVE EXAMPLE |
| 49 | 2.7 | 0.71 | 91.5 | 88.2 | EXAMPLE |
| 50 | 1.4 | 0.65 | 91.8 | 88.0 | EXAMPLE |
| 51 | 0.3 | 0.51 | 93.1 | 88.8 | EXAMPLE |
| 52 | 0.3 | 0.49 | 93.1 | 88.1 | EXAMPLE |
| 53 | 0.4 | 0.58 | 89.2 | 84.2 | EXAMPLE |
| 54 | 0.2 | 0.52 | 92.3 | 88.0 | EXAMPLE |
| 55 | 0.0 | 0.48 | 93.5 | 88.1 | EXAMPLE |
| 56 | 0.1 | 0.50 | 89.2 | 85.1 | EXAMPLE |

In the system containing about 0.0045% by mass of Pr and about 0.001% by mass of La (sample number 49) as well, the effect of Ti on the shape of the press-bonded ball was great. Particularly, the fraction of the petal-like defects was improved remarkably in terms of both number and degree. As a result, the standard deviation of press-bonded diameter and the shear strength of the press-bonded ball also improved.

Furthermore, in the case that 0.0002% or more by mass of Be was added to the above-mentioned system, these evaluation results became even better (sample numbers 50-53). Specifically, the Y/X ratio of the press-bonded ball diameter in the ultrasonic waves direction (Y direction) to its perpendicular direction (X direction) became substantially one. Thus, the defective fraction of the press-bonded balls improved still further. FIG. 1 is an optical microscope image of typical press-bonded balls, showing sample 48 (on the left side (1) of FIG. 1) and sample 51 (on the right side (2) of FIG. 1), each being observed from top side thereof. As can be seen from FIG. 1, the roundness of the bonding wires containing Ti and Be improves.

Pd was further added to the sample systems, which had already yielded satisfactory results, containing about 0.0045% by mass of Pr, about 0.001% by mass of La, 0.003% by mass of Ti, and about 0.007% by mass of Be, and then evaluation thereof was carried out in the same manner (sample numbers 54-56). As a result, it was found that the fraction of the petal-like defects decreased still further by adding Pd.

It was revealed from the above results that in the bonding wires the strength and Young's modulus of which were improved by adding rare earth elements, the fraction of the petal-like defects specifically is decreased and the roundness of press-bonded ball is improved by adding Ti thereto; adding 0.0002% or more by mass of Be to the system enables the anisotropy of the press-bonded ball to be specifically reduced; and adding Pd leads to further improvement of the fraction of the petal-like defects.

Sixth Example

The relationship between the crystal grain size and the press-bonding shape was studied for the bonding wires comprised of the components in accordance with the present invention. Prepared were the component systems where 0.0034 to 0.0052% by mass of either one of Pr, La and Nd as well as about 0.0015% by mass of Ca was added to improve the strength and the Young's modulus, and then 0.0006% by mass of Be and 0.003% by mass of either In or Ga were added thereto, and the systems thus prepared were studied.

Necessary quantities of Pr, Ca, La, Nd, Ti, Be, In, Ga and Ni were added to the gold material of a purity of 99.9998% or more by mass, and cast into ingots of 5 mm in diameter and 100 mm in length. After the casting, the composition of each sample was analyzed, and it was confirmed that the contents of Ca, rare earth elements, Pb, Sn, Li and Na other than the addition elements were 0.0002% or less by mass.

Then, the ingots were each rolled to about 2 mm square using a groove rolling device, and drawn to a 23 μm in diameter using a diamond dies in a lubricating liquid. In the drawing process, a reduction in area per each passage through the die was about 12%. Thereafter, heat treatment (thermal refining) was continuously performed using a tubular furnace in Ar atmosphere, and thus the bonding wire samples were prepared while varying temperatures to adjust a breaking elongation to 4%. The reduction in cross-section area amounted to 99.54% as compared to that of the ingot.

The breaking strength, the Young's modulus in the longitudinal direction, and the bondability were evaluated. In the system prepared in accordance with the present example, the Young's modulus was 85 GPa or more in all the ranges where the breaking elongation was adjusted to 10% or less.

The Young's moduli of the bonding wire samples breaking elongations of which were adjusted to 4% reached 89 GPa or more in all the bonding wire samples. For the bonding wire samples in which Pr was replaced by the same amount of La or Nd, examination of the textures thereof by EBSD analysis revealed that they were formed with polycrystalline fibrous texture extending from about 0.1 to 0.5 μm in the wire diameter direction thereof and from about 0.5 to several tens μm in the longitudinal direction thereof, and that most of the crystal grains thereof were <111> oriented along the longitudinal direction of the bonding wires. That is why the Young's moduli were so high.

The bonding test was performed using 8028 pps made by K&S Inc. As a capillary was used T13-11(8) made by TOTO Ltd. A semiconductor chip of 480 μm height was connected with a 42 alloy lead frame, using the above-mentioned bonding wires. The first bonding was performed on an Al—Cu electrode at the semiconductor chip side while a wedge bonding (the second bonding) was performed on a silver plated electrode at the 42 alloy side. The average diameter of the press-bonded balls was adjusted to approximately 41 μm. The wire span was 3 mm, and the loop height from the electrode pad was 150 μm. The bonding was carried out in the atmosphere, and the bonding temperature was set at 150° C.

Prior to the evaluation of the bondability, FABs were formed by arc-discharge to the ends of the bonding wires using a bonder, under the same conditions as the wire bonding conditions, and then the FABs thus formed were collected.

Then, the collected FABs were ground to allow center cross sections (C sections) thereof perpendicular to the longitudinal direction of bonding wires to appear, which were then subjected to chemical polishing to eliminate the distortions. Thereafter, the solidification structures of the samples thus obtained were observed. The solidification structures were observed by EBSD, and the number of the crystal grains within the center cross section was measured. Here, the crystal grains of melting solidification structures of FABs become finer as the number of crystal grains increases. The number of the crystal grains was determined by calculating an average number thereof by observing the C sections of five FABs.

The bondability was evaluated using the following evaluation items: a fraction of petal-like defects where a concave portion appear in the peripheral outer edge of the press-bonding ball as viewed from thereabove, i.e., petal-like defect rate calculated by obtaining the sum of the number of bondings where the ratio (Y/X) of the press-bonding diameter in the ultrasonic waves applying direction (Y direction) to the press-bonding diameter in the direction perpendicular thereto (X direction) exceeded 1.1 and the number of bondings where the petal-like defect occurred, then dividing the sum by a total number of the bondings; a deviation of average values of the press-bonding diameters in the ultrasonic wave applying direction (Y direction) and the direction perpendicular thereto (X direction) (standard deviation); a shear strength of the press-bonded ball indicating the bonding strength of the first bonding and the second bonding; and a peel strength of the second bonding. The total number of the bondings was 1,000.

The shear strength of the press-bonded ball was measured by moving a tool parallel to an electrode pad at a 1 μm height from the electrode pad and then shearing off the press-bonded ball. The number of measurements of the shear strength was 50.

Table 6 shows the mechanical characteristics and the evaluation results of the bonding wires of 4% predetermined elongation prepared in accordance with the sixth example.

TABLE 6

| SAMPLE NUMBER | COMPONENTIAL ANALYSIS VALUE (mass ppm) | | | | | | | | | | | | | GOLD WIRE MECHANICAL CHARACTERISTIC | |
|---|---|---|---|---|---|---|---|---|---|---|---|---|---|---|---|
| | Pr | Ca | La | Ce | Nd | Be | Ti | V | Cr | Nb | In | Ga | Ni | Au | STRENGTH (MPa) | YOUNG'S MODULES (GPa) |
| 57 | 35 | 15 | | | | 6 | | | | | 30 | | | THE BALANCE | 302 | 90.8 |
| 58 | 36 | 14 | | | | 7 | 11 | | | | 29 | | | THE BALANCE | 304 | 91.0 |
| 59 | 35 | 15 | | | | 6 | 30 | | | | 30 | | | THE BALANCE | 301 | 90.2 |
| 60 | 34 | 16 | | | | 6 | 50 | | | | 30 | | | THE BALANCE | 301 | 90.3 |
| 61 | 35 | 15 | | | | 6 | | 10 | | | 20 | | | THE BALANCE | 301 | 90.0 |
| 62 | 35 | 16 | | | | 7 | | 31 | | | 20 | | | THE BALANCE | 300 | 90.9 |
| 63 | 36 | 15 | | | | 6 | | 49 | | | 21 | | | THE BALANCE | 305 | 90.4 |
| 64 | 35 | 16 | | | | 7 | 5 | 5 | | | 20 | | | THE BALANCE | 302 | 90.0 |
| 65 | 35 | 16 | | | | 6 | 20 | 20 | | | 21 | | | THE BALANCE | 302 | 90.0 |
| 66 | | 14 | 52 | | | 6 | 30 | | | | 29 | | | THE BALANCE | 300 | 89.8 |
| 67 | | 15 | | 51 | | 6 | 30 | | | | 30 | | | THE BALANCE | 298 | 89.7 |
| 68 | | 15 | | | 52 | 6 | 30 | | | | 30 | | | THE BALANCE | 299 | 90.0 |
| 69 | 35 | 15 | | | | 7 | | | 31 | | 20 | | | THE BALANCE | 302 | 90.0 |
| 70 | 35 | 15 | | | | 6 | | | | 31 | 21 | | | THE BALANCE | 300 | 90.1 |
| 71 | 35 | 15 | | | | 7 | 10 | | | | | 30 | | THE BALANCE | 302 | 91.3 |
| 72 | 35 | 15 | | | | 6 | 11 | | | | | | 50 | THE BALANCE | 303 | 90.9 |

| SAMPLE NUMBER | BONDABILITY | | | | | REMARKS |
|---|---|---|---|---|---|---|
| | AVERAGE NUMBER OF THE CRYSTAL GRAINS WITHIN THE FAB (PIECES) | FRACTION OF THE PETAL-LIKE DEFECT (%) | ANISOTROPY (Y/X) | DEFECTIVE FRACTION OF THE PRESS-BONDING BALL (%) | SHEAR STRENGTH OF THE PRESS-BONDING BALL (MPa) | |
| 57 | 65 | 10.5 | 1.03 | 11.1 | 91.1 | COMPARATIVE EXAMPLE |

TABLE 6-continued

| | | | | | | |
|---|---|---|---|---|---|---|
| 58 | 83 | 0.1 | 1.01 | 0.2 | 92.5 | EXAMPLE |
| 59 | 95 | 0.0 | 1.00 | 0.0 | 93.4 | EXAMPLE |
| 60 | 107 | 0.0 | 1.00 | 0.0 | 93.1 | EXAMPLE |
| 61 | 82 | 0.0 | 1.01 | 0.1 | 92.5 | EXAMPLE |
| 62 | 98 | 0.0 | 1.00 | 0.0 | 93.0 | EXAMPLE |
| 63 | 108 | 0.0 | 0.99 | 0.0 | 93.0 | EXAMPLE |
| 64 | 77 | 0.0 | 1.00 | 0.0 | 92.5 | EXAMPLE |
| 65 | 100 | 0.0 | 1.00 | 0.0 | 93.1 | EXAMPLE |
| 66 | 93 | 0.5 | 1.01 | 1.9 | 92.5 | EXAMPLE |
| 67 | 92 | 0.4 | 1.00 | 1.8 | 92.7 | EXAMPLE |
| 68 | 92 | 0.4 | 1.00 | 1.7 | 92.8 | EXAMPLE |
| 69 | 72 | 0.2 | 1.00 | 1.0 | 93.0 | EXAMPLE |
| 70 | 75 | 0.2 | 1.00 | 0.9 | 93.0 | EXAMPLE |
| 71 | 86 | 0.0 | 1.00 | 0.0 | 93.8 | EXAMPLE |
| 72 | 87 | 0.0 | 1.00 | 0.0 | 94.0 | EXAMPLE |

The number of the crystal grains within the FAB cross section increased as the content of Ti or V became large. In other words, it was found that Ti and V have a structure-refining effect on the FAB solidification structure. Cr and Nb also showed such refining effect on FABs solidification structure, yet no effect comparable to that of Ti and V was seen.

On the other hand, in the tested range, the defective fraction of the press-bonding balls containing both Ti and V became low level (sample numbers 64, 65). Such extremely small defective fractions of the press-bonded balls are attributed to the combined additions of Be, Ti and V. The effect of adding Ti and V are attributed to the fact that isotropic nature in deformation at the time of press bonding the FAB increased due to the resultant refinement of the solidification structures.

Comparison of the press-bonding shapes among those containing Pr (sample number 59), La (sample number 66) and Nd (sample number 68) showed that the press-bonding shape of the bonding wire containing Pr was superior. This is because the content of Pr can be smaller than that of La or Nd when the same strength and Young's modulus are to be obtained, so that the FAB containing Pr becomes less likely to be oxidized at the time of the FAB formation.

Among the bonding wires samples evaluated in the present example, any of the bonding wires samples containing Ti, V, Cr or Nb (sample numbers 58-72) indicated good press-bonding shapes. In particular, the bonding wires having excellent press-bonding shapes can be prepared by adding Be in combination with at least one of Ti and V (sample numbers 58-65, 71, 72). Furthermore, when Pr is selected from among the rare earth elements, and added as a main element in combination with Ca, it is possible to obtain a bonding wire having markedly excellent strength, Young's modulus and press-bonding shape to meet the need for downsizing of the semiconductor mounting size.

The invention claimed is:

1. A gold wire for semiconductor element connection which comprises:
   one or more elements selected from Ca and rare earth elements in total amounts of at least 0.001% by mass but not more than 0.02% by mass;
   one or more elements selected from a group consisting of Ti, V, Cr, Hf, Nb, W and Zr in total amounts of at least 0.0005% by mass but not more than 0.01% by mass;
   a Pr content of at least 0.0016% by mass but not more than 0.0079% by mass, and
   a balance of gold and unavoidable impurities, wherein crystal grains are <111>-oriented along a longitudinal direction of the wire, and
   said wire is formed to a reduction in cross-sectional area of 99.8% or more as compared to an ingot thereof.

2. The gold wire for semiconductor element connection according to claim 1, comprising at least one element selected from a group consisting of Ca, La, Ce, Pr, Nd and Sm in total amounts of more than 0.005% by mass but not more than 0.02% by mass, wherein a content of Ca is 0.0025% or less by mass.

3. The gold wire for semiconductor element connection according to claim 1, further comprising Pd of 0.001% or more by mass but not more than 2% by mass.

4. The gold wire for semiconductor element connection according to claim 1, further comprising Be of 0.0002% or more by mass but not more than 0.0011% by mass.

5. The gold wire for semiconductor element connection according to claim 1, wherein said gold wire has an elastic modulus of 85 GPa or more in the longitudinal direction thereof.

6. The gold wire for semiconductor element connection according to claim 3, further comprising Be of 0.0002% or more by mass but not more than 0.0011% by mass.

7. The gold wire for semiconductor element connection according to claim 3, wherein said gold wire has an elastic modulus of 85 GPa or more in the longitudinal direction thereof.

8. The gold wire for semiconductor element connection according to claim 4, wherein said gold wire has an elastic modulus of 85 GPa or more in the longitudinal direction thereof.

9. The gold wire for semiconductor element connection according to claim 6, wherein said gold wire has an elastic modulus of 85 GPa or more in the longitudinal direction thereof.

10. The gold wire for semiconductor element connection according to claim 1, wherein said wire is formed into a press-bonded ball with a defect rate between 2.6% and 9.7%.

11. The gold wire for semiconductor element connection according to claim 1, further comprising at least one element selected from a group consisting of In, Ga and Ni in total amounts of 0.005% or less by mass.

12. The gold wire for semiconductor element connection according to claim 2, further comprising at least one element selected from a group consisting of In, Ga and Ni in total amounts of 0.005% or less by mass.

13. The gold wire for semiconductor element connection according to claim 3, further comprising at least one element selected from a group consisting of In, Ga and Ni in total amounts of 0.005% or less by mass.

14. The gold wire for semiconductor element connection according to claim 4, further comprising at least one element selected from a group consisting of In, Ga and Ni in total amounts of 0.005% or less by mass.

15. The gold wire for semiconductor element connection according to claim 5, further comprising at least one element selected from a group consisting of In, Ga and Ni in total amounts of 0.005% or less by mass.

16. The gold wire for semiconductor element connection according to claim 6, further comprising at least one element selected from a group consisting of In, Ga and Ni in total amounts of 0.005% or less by mass.

17. The gold wire for semiconductor element connection according to claim 7, further comprising at least one element selected from a group consisting of In, Ga and Ni in total amounts of 0.005% or less by mass.

18. The gold wire for semiconductor element connection according to claim 8, further comprising at least one element selected from a group consisting of In, Ga and Ni in total amounts of 0.005% or less by mass.

19. The gold wire for semiconductor element connection according to claim 9, further comprising at least one element selected from a group consisting of In, Ga and Ni in total amounts of 0.005% or less by mass.

20. The gold wire for semiconductor element connection according to claim 10, further comprising at least one element selected from a group consisting of In, Ga and Ni in total amounts of 0.005% or less by mass.

* * * * *